US008887571B2

(12) United States Patent
Dienel et al.

(10) Patent No.: US 8,887,571 B2
(45) Date of Patent: Nov. 18, 2014

(54) VIBRATING MICROMECHANICAL SYSTEM HAVING BEAM-SHAPED ELEMENT

(75) Inventors: Marco Dienel, Oederan (DE); Roman Forke, Chemnitz (DE); Dirk Scheibner, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 347 days.

(21) Appl. No.: 13/262,592

(22) PCT Filed: Mar. 31, 2009

(86) PCT No.: PCT/EP2009/002512
§ 371 (c)(1),
(2), (4) Date: Sep. 30, 2011

(87) PCT Pub. No.: WO2010/112051
PCT Pub. Date: Oct. 7, 2010

(65) Prior Publication Data
US 2012/0017683 A1    Jan. 26, 2012

(51) Int. Cl.
*G01N 29/00* (2006.01)
*B81B 3/00* (2006.01)

(52) U.S. Cl.
CPC ......... *B81B 3/0078* (2013.01); *B81B 2201/025* (2013.01); *B81B 2203/0118* (2013.01)
USPC .......................................... 73/587; 73/504.12

(58) Field of Classification Search
USPC ............... 73/587, 504.12, 504.16, 514.01
See application file for complete search history.

(56) References Cited

U.S. PATENT DOCUMENTS

| | | | | |
|---|---|---|---|---|
| 5,834,646 A * | 11/1998 | Kvisteroy et al. | .......... | 73/514.29 |
| 5,914,520 A * | 6/1999 | Werner | .......... | 257/415 |
| 5,926,591 A * | 7/1999 | Labeye et al. | .......... | 385/25 |
| 6,761,068 B1 * | 7/2004 | Schmid | .......... | 73/504.14 |
| 7,430,908 B2 * | 10/2008 | Westby | .......... | 73/504.04 |
| 7,485,958 B2 | 2/2009 | Ikehashi | | |
| 7,523,663 B2 * | 4/2009 | Willig et al. | .......... | 73/504.12 |
| 2006/0108465 A1 | 5/2006 | Barscevicius et al. | | |
| 2007/0163346 A1 | 7/2007 | Platt et al. | | |

FOREIGN PATENT DOCUMENTS

| | | |
|---|---|---|
| DE | 196 46 667 A1 | 5/1998 |
| EP | 1602624 A1 | 12/2005 |
| JP | 2004-261884 | 9/2004 |

(Continued)

OTHER PUBLICATIONS

Shakib Morshed et al., "Enhancing the sensitivity of microcantilever-based sensors via geometry modification", Proceedings of the SPIE, The International Society for Optical Engineering, vol. 6223, Jan. 2006, pp. 1-9.
German Translation of Japanese Office Action issued Jun. 3, 2013 in corresponding Japanese Application No. 2012-502461.

(Continued)

*Primary Examiner* — J M Saint Surin
(74) *Attorney, Agent, or Firm* — Staas & Halsey LLP

(57) ABSTRACT

An exposed end of a micromechanical system having at least one beam-shaped element is connected to a further element of the micromechanical system at the other end thereof. To optimize the mechanical properties of the micromechanical system, recesses are provided in the beam-shaped element in such a way that the mass of the beam-shaped elements decreases toward the exposed end.

15 Claims, 3 Drawing Sheets

(56) References Cited

FOREIGN PATENT DOCUMENTS

| | | |
|---|---|---|
| JP | 2005-536329 | 12/2005 |
| JP | 2007-167998 | 7/2007 |
| JP | 2008-36726 | 2/2008 |
| WO | 01/61846 A1 | 8/2001 |
| WO | 2004/017119 A1 | 2/2004 |
| WO | WO2008125071 * | 10/2008 |

OTHER PUBLICATIONS

Office Action mailed Nov. 26, 2013 in corresponding Chinese Application No. 200980158528.9.
English Abstract of DE 19646667 A1 (Ref. AG in the IDS filed Jan. 12, 2012).
International Search Report for PCT/EP2009/002512; mailed Dec. 28, 2009.

* cited by examiner

VIBRATING MICROMECHANICAL SYSTEM HAVING BEAM-SHAPED ELEMENT

CROSS REFERENCE TO RELATED APPLICATIONS

This application is the U.S. national stage of International Application No. PCT/EP2009/002512, filed Mar. 31, 2009 contents of which are hereby incorporated by reference herein in their entirety.

BACKGROUND

The described below is a micromechanical system having at least one beam-shaped element, which has an exposed end and is connected at its other end to a further element of the micromechanical system.

Micromechanical systems, which are often also referred to as micro systems or MEMS (micro electro mechanical system), are becoming increasingly popular in particular on account of their small size, their comparatively low price and also their high reliability. This relates for example to the use of micromechanical systems as sensors, for instance in the form of sensors for the detection of acoustic emissions, solid-borne sound sensors, acceleration sensors and tilt sensors, angular rate sensors or pressure sensors.

Acoustic emissions (AE) are normally understood to be a phenomenon wherein elastic waves are generated by an impact excitation resulting from a sudden release of energy within a solid body. Corresponding acoustic emission signals, which propagate in the form of structure-borne sound in the solid body, normally occur in a frequency range of about 20 kHz up to about 1 MHz. In this situation, acoustic emission signals exhibit a high sensitivity with regard to mechanical damage to a solid body or to an object. Micromechanical sensors for the detection of acoustic emissions (acoustic emission sensors) are therefore employed in particular for monitoring the wear of mechanical components such as roller bearings for example. In this situation, corresponding sensors normally have a system capable of vibration having a seismic mass suspended or secured on spring elements. External forces or accelerations cause a deflection of the seismic mass with respect to a fixed suspension. This relative movement is evaluated, whereby a capacitive principle is often applied for signal recovery. In this connection, the seismic mass includes electrode arrangements which can for example be implemented like a comb and together with a fixed counter electrode form a variable capacitance. In this connection it is possible to detect acoustic emissions by sensing the value of the capacitance or any change therein. In this situation, it is assumed as a general rule that the seismic mass itself and also the electrode arrangements form inherently inflexible elements in the respective usable frequency range.

There is currently a trend towards ever higher natural frequencies of micromechanical systems. This applies both to wideband applications and also to resonant systems. In addition to the sensors already mentioned for the detection of acoustic emissions, micromechanical filters and mixers for the high-frequency range may be quoted here as further examples.

Micromechanical systems are manufactured for example by dry etching processes employing surface and near-surface MEMS technology. As a general rule the structures or systems thus manufactured have a high aspect ratio (HAR). In this situation, such a high aspect ratio of the structures is normally required in order to minimize the cross sensitivity of the system and at the same time to increase the sensitivity in the movement direction.

One advantage of micromechanical systems of the aforementioned type lies in the capability for batch processing in the wafer and the low manufacturing costs resulting therefrom. In this context, the space requirement for the micromechanical system is a major cost factor because a smaller space requirement enables a higher chip density on the wafer.

On the other hand, to achieve a high sensitivity of micromechanical or microelectromechanical systems large surface area electrodes or electrode systems are often required. In order to obtain as large an electrode surface area as possible the surface of the electrode systems is often increased here by vertical structuring whilst the lateral dimensions remain unchanged, whereby the "lateral" or "vertical" particulars relate in each case to the wafer plane. This produces ramified electrode structures, for example. With regard to such electrode structures, there is however in practice a danger that the natural frequency of the micromechanical system, or of a system capable of vibrating of the micromechanical system, is reduced on account of the high seismic mass of the electrodes and on account of the suspension of the latter. This relates for example to the case where the electrodes have a so-called interdigital structure and the suspension of the electrodes is implemented by beam structures.

Generally speaking, there is a requirement that the electrode structures themselves exhibit a very high rigidity or a very high natural frequency so as to exclude any influence on the functioning of the micromechanical system. One way of guaranteeing this is the use of solid, large surface area carrier systems. This is however accompanied by the disadvantage that corresponding large surface area carrier systems have a large space requirement and thus counteract the previously described efforts directed towards a particularly cost-effective manufacture of corresponding micromechanical systems. A tapering for example of beam structures for the suspension of the electrodes, conceivable in principle, is as a general rule disadvantageous or not possible on account of the cubic reduction associated therewith in the rigidity of the structure. On the other hand, a widening of the beams in accordance with the above statements counteracts the efforts directed towards a low space requirement. Although a general reduction in size of the micromechanical system results in higher natural frequencies, this does however have the disadvantage here that a decrease in the sensitivity of the micromechanical system results at the same time.

The above statements and problems also apply with regard to further beam-shaped elements of the micromechanical system which have an exposed end and are connected at their other end to a further element of the micromechanical system. This also includes passive elements such as for example shielding electrodes or other structures in the form of beam-shaped elements which are suspended on one side at an anchor point. There is also a requirement here for these structures to exhibit a high rigidity and at the same time occupy as little as possible of the silicon surface area essentially determining the price of the micromechanical system.

SUMMARY

An aspect is a micromechanical system of the type described in the introduction, which is particularly advantageous in respect of mechanical properties and also its manufacturing costs.

This is achieved by a micromechanical system having at least one beam-shaped element, which has an exposed end and is connected at its other end to a further element of the micromechanical system, whereby recesses are provided in the beam-shaped element in such a manner that the mass of the beam-shaped element decreases towards the exposed end.

Although a method is known from the published US patent application US 2007/0163346 A1 for influencing the frequency of a seismic mass by use of recesses in such a manner that rotation modes of the seismic mass, in other words of the entire movable mass, have their frequency shifted towards higher values, US 2007/0163346 A1 does not however provide information about providing recesses in the beam-shaped element, in such a manner that the mass of the beam-shaped element decreases towards the exposed end, in order to increase the natural frequency of a beam-shaped element of a micromechanical system.

Recesses are provided in the beam-shaped element in such a manner that the mass of the beam-shaped element decreases towards the exposed end. This means that the mass distribution of the beam-shaped element is inhomogeneous, whereby the mass per unit length of the beam-shaped element on average decreases towards the exposed end on account of the recesses. The mass of the beam-shaped element is thus less in the region of the exposed end than in the region of the other end. In this situation, the beam-shaped element is suspended on one side or mounted on one side, in other words has only one anchor point or fixing point, similar to a w.

The micromechanical system is advantageous because it permits an increase in the natural frequency of the beam-shaped element with the sensitivity remaining the same and the same dimensions or the reduction of the dimensions of the beam-shaped element with the natural frequency and sensitivity remaining the same. Furthermore, according to the specific requirements, an optimization can basically also take place to the effect that both the natural frequency is increased and also the dimensions are reduced.

The micromechanical system can be manufactured for example by dry etching processes for different near-surface technologies, HARM (high aspect ratio micromachining) technologies or surface technologies.

In principle, the beam-shaped element of the micromechanical system can be part of any active or passive component of the system. This includes both movable and also stationary elements. In this situation, the micromechanical system is advantageous in particular for those systems which are designed for higher frequencies or are subjected to higher frequency loads.

According to a development of the micromechanical system, the beam-shaped element is part of an electrode of the micromechanical system. This is advantageous because according to the previous statements in particular with regard to electrodes of micromechanical systems the requirement exists for a high rigidity with a low space requirement at the same time.

According to a further embodiment, the micromechanical system can also be designed in such a manner that the micromechanical system has a system capable of vibration which has a seismic mass and the beam-shaped element is connected to the seismic mass. This is advantageous because in particular beam-shaped elements connected to a seismic mass of a system capable of vibration are subjected to high mechanical loads. Moreover, any influencing of the usable frequency range of the system capable of vibration by the natural frequencies of individual beam-shaped elements is to be avoided. In particular for such micromechanical systems or beam-shaped elements of such systems, an increase in the natural frequency and, associated therewith, in the rigidity of the element, is thus of great importance. It should be noted in this situation that the natural frequency is proportional to the root of the quotient from the rigidity and the mass.

In principle, any shape can be employed for the recesses in the beam-shaped element. Crucial in this situation is simply the fact that the recesses are provided in such a manner that the mass of the beam-shaped element decreases towards the exposed end. According to a further embodiment of the micromechanical system, the recesses can thus be designed as through-openings or as blind holes.

In principle, the micromechanical system can be a micromechanical system of any type. The micromechanical system can thus be designed for example as an actuator. According to a development, the micromechanical system is designed as a sensor. This is advantageous because micromechanical sensors are used increasingly for different applications on account of their comparatively low price as well as their high reliability.

According to a further embodiment, the micromechanical system is designed as a sensor for the detection of acoustic emission signals. This is advantageous because sensors for detecting acoustic emissions as a general rule detect vibrations above the audible range, in other words for example in the ultrasound range. On account of the mechanical loads associated herewith and in order to avoid influencing the measurement it is particularly important in this situation that the beam-shaped element has a high natural frequency and high rigidity at the same time.

A method for creating a micromechanical system having at least one beam-shaped element is described below. The method produces a micromechanical system having at least one beam-shaped element which is particularly advantageous in respect of its mechanical properties as well as its manufacturing costs.

This method creates a micromechanical system having at least one beam-shaped element, which has an exposed end and is connected at its other end to a further element of the micromechanical system, whereby a) the mechanical loads occurring inside mass elements of the beam-shaped element during operation of the micromechanical system are determined and b) mass elements which are not or only comparatively lightly loaded are removed from the beam-shaped element by use of recesses.

The method is advantageous because it permits the creation or development of a micromechanical system, the at least one beam-shaped element of which is optimized in respect of increasing its natural frequency with the sensitivity remaining the same and the same dimensions or in respect of reducing its dimensions with the natural frequency and sensitivity remaining the same. This is done by determining the mechanical loads occurring inside mass elements of the beam-shaped element during operation of the micromechanical system and removing mass elements which are not or only comparatively lightly loaded from the beam-shaped element by use of recesses. This serves to ensure that the rigidity of the micromechanical system essentially remains unchanged while at the same time the natural frequency thereof is increased on account of the reduction in the mass of the beam-shaped element.

According to a development of the method, operations (a) and (b) are iteratively repeated. Such an iterative procedure is advantageous because as a general rule it permits the best possible optimization of the micromechanical system or of the beam-shaped element of the micromechanical system. In this situation, iteration may take place for as long as an improvement in the mechanical properties of the beam-shaped element continues to be achieved. In this situation, an optimization can take place on the one hand to the effect that the natural frequency of the beam-shaped element is increased with essentially the sensitivity remaining the same and the same dimensions; in addition or as an alternative thereto, an optimization can also take place in such a manner that the dimensions of the beam-shaped element are reduced with essentially the natural frequency and sensitivity remaining the same.

According to another development, the method can also be carried out in such a manner that the mass elements which are not, or are only comparatively lightly, loaded are removed from the beam-shaped element by use of recesses in such a manner that the mass of the beam-shaped element decreases towards the exposed end. This embodiment is particularly advantageous in respect of the desired increase in the natural frequency of the beam-shaped element of the micromechanical system.

The method can also be designed in such a manner that the mechanical loads occurring inside mass elements of the beam-shaped element during operation of the micromechanical system are determined by using a computerized simulation model at least of the beam-shaped element. This is advantageous because the use of a computerized simulation model permits a particularly powerful optimization of the micromechanical system with comparatively little effort.

In principle, different methods known in their own right in various areas of technology in connection with corresponding optimization requirements can be used as a simulation model. According to an embodiment of the method, a model according to a finite elements method (FEM) is used as a simulation model. This is advantageous because it is a computerized calculation method widely used in engineering.

According to a further embodiment of the method, the mechanical loads occurring inside mass elements of the beam-shaped element during operation of the micromechanical system are determined by a comparative stress analysis. Corresponding comparative stress analyses are often used within the scope of topology optimizations and can therefore advantageously be employed with comparatively little effort.

The method can also be designed in such a manner that the mass elements are removed from the beam-shaped element in the form of recesses designed as through-openings or as blind holes.

BRIEF DESCRIPTION OF THE DRAWINGS

These and other aspects and advantages will become more apparent and more readily appreciated from the following description of the exemplary embodiments, taken in conjunction with the accompanying drawings of which.

Figure 1:
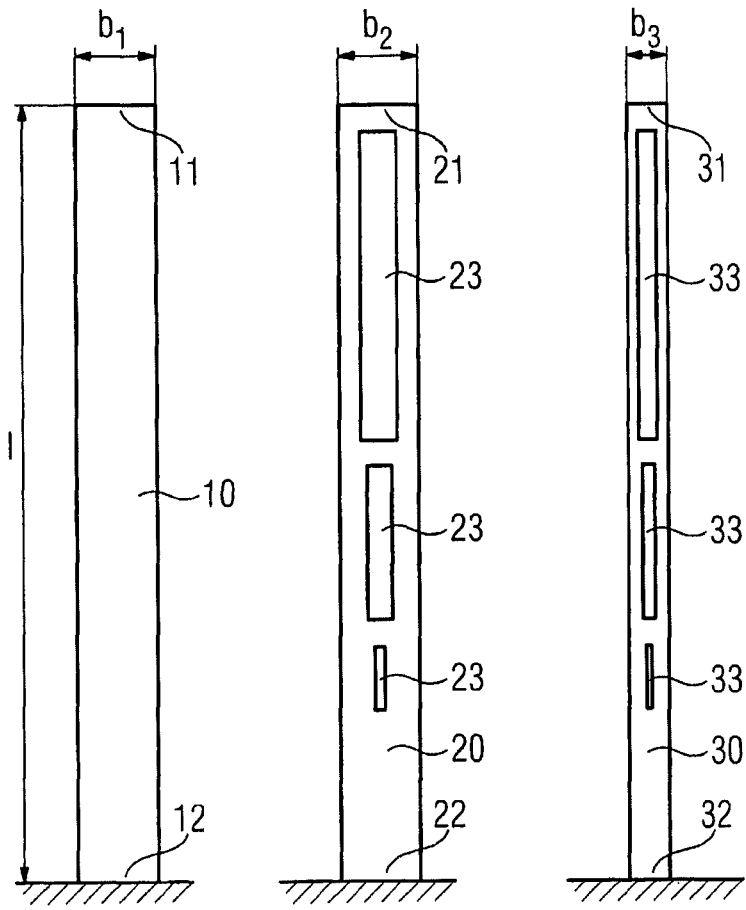
FIG. 1 is a schematic view of a comparison of a known beam-shaped element of a micromechanical system with first embodiments of beam-shaped elements of the micromechanical system.

It should be noted that a top view of the respective structure is shown in each case in the figures.

DETAILED DESCRIPTION OF THE PREFERRED EMBODIMENT

Reference will now be made in detail to the preferred embodiments, examples of which are illustrated in the accompanying drawings, wherein like reference numerals refer to like elements throughout.

FIG. 1 shows a schematic view of a comparison of a known beam-shaped element of a micromechanical system with first embodiments of beam-shaped elements of the micromechanical system. Shown on the one side is a beam-shaped element 10 of a known micromechanical system. In this situation the beam-shaped element 10 has a length l, a width $b_1$, an exposed end 11, and another end 12 secured to a further element of the micromechanical system.

In order to now enable an increase in the natural frequency of the beam-shaped element 10 whilst maintaining its lateral dimensions or to enable a minimization of its lateral extent with the natural frequency remaining the same, an optimization of the micromechanical system or of the beam-shaped element 10 is desirable.

The creation of such a micromechanical system optimized in respect of its mechanical properties as well as its manufacturing costs can now for example happen in such a manner that a finite elements method (FEM) model of the beam-shaped element 10 or of the entire micromechanical system is created. By an analysis using the finite elements method, by employing appropriate software available on the market it is possible to determine and represent a calculation of the mechanical loads occurring inside mass elements of the beam-shaped element during operation of the micromechanical system for example through a comparative stress analysis (equivalent stress).

Unloaded, in other words not or only comparatively lightly loaded, mass elements can be removed from the structure, in other words the beam-shaped element 10, in the simulation model by use of recesses. In the following, an optimization of the micromechanical system or of its beam-shaped element 10 can be carried out by an iterative procedure through repetition of the aforementioned operations. At this point it should be noted that as a general rule a micromechanical system will have several or many corresponding beam-shaped elements, whereby the described method can be carried out depending on the respective circumstances and requirements for one, several or all of the beam-shaped elements of the micromechanical system.

Since the silicon material normally used for the manufacture of micromechanical systems can normally only be masked two-dimensionally with regard to the technological process used, the structuring, in other words the production of the recesses, may be performed by deep etching. The procedure described enables the mass of the beam-shaped element to be greatly reduced, whereby the rigidity of the beam-shaped element is however maintained.

Corresponding optimized beam-shaped elements 20 and 30 are shown in FIG. 1 to the right of the known beam-shaped element 10. In addition to the exposed end 21 or 31 and the other end 22 or 32, the beam-shaped elements 20 or 30 shown have recesses 23 or 33 which are arranged in such a manner that the mass of the respective beam-shaped element 20 or 30 decreases towards the exposed end 21 or 31 of the beam-shaped element 20 or 30.

On account of the recesses 23, the beam-shaped element 20 advantageously has a higher natural frequency in comparison with the known beam-shaped element 10 at the same width ($b_2=b_1$). By contrast, the natural frequency of the beam-shaped element 30 compared to that of the known beam-shaped element 10 is unchanged, whereby the width $b_3$ of the beam-shaped element 30 is significantly reduced compared with the width $b_1$ of the known beam-shaped element 10. This results in a smaller space requirement for the beam-shaped element 30, which leads to a corresponding reduction in manufacturing costs for the micromechanical system.

Figure 2:
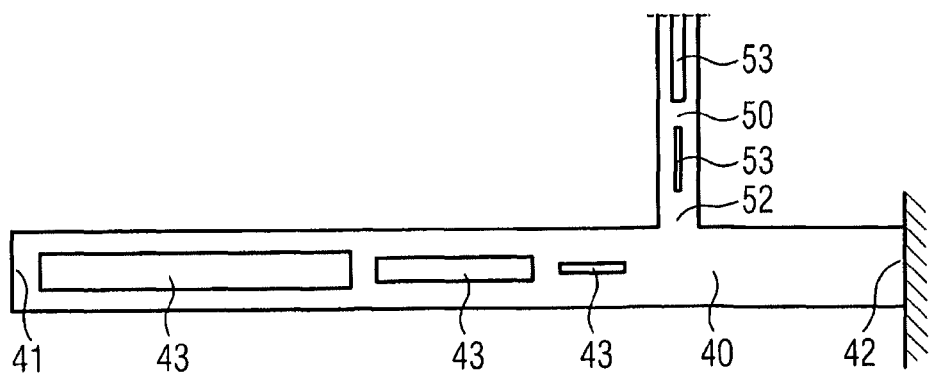
FIG. 2 is a schematic view of second embodiments of beam-shaped elements of micromechanical systems.

FIG. 2 shows a schematic view of second embodiments of beam-shaped elements of micromechanical systems. It is discernible from FIG. 2 that the beam-shaped elements 40 or 50 can fulfill different tasks within the micromechanical system. The beam-shaped element 40 which has one exposed end 41, one other end 42 and recesses 43 thus itself serves as a carrying structure for further functional groups in the form of the further beam-shaped element 50 which is connected to the beam-shaped element 40. With regard to the further beam-shaped element 50, for which only its end 52 secured to the beam-shaped element 40 and a part of a recess 53 are shown, by contrast this can for example be a branching or ramification of an electrode of a micromechanical or microelectromechanical system.

Figure 3:
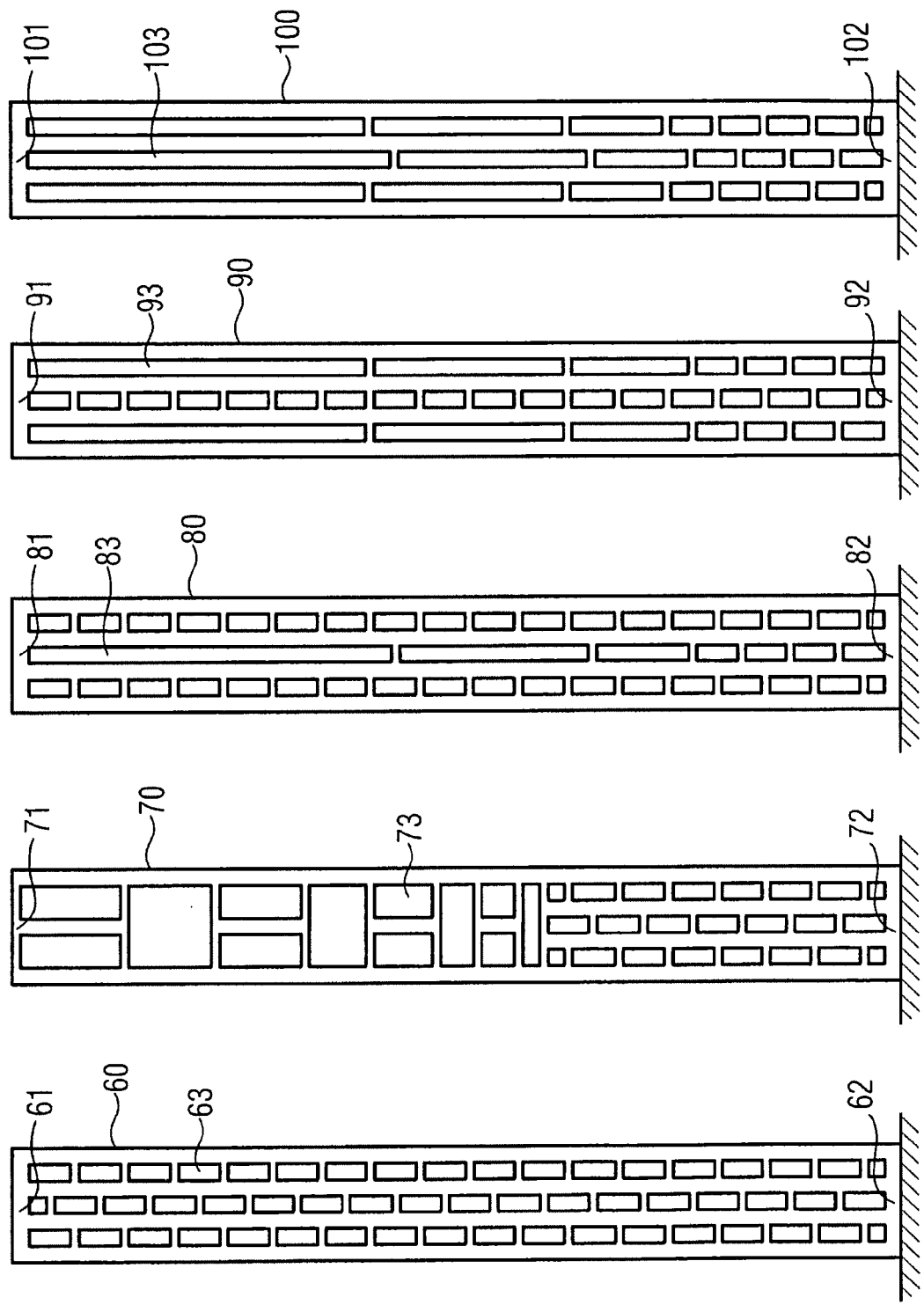
FIG. 3 is a schematic view of a comparison of a beam-shaped element, having recesses resulting from the manufacturing process, of a known micromechanical system with third embodiments of beam-shaped elements of micromechanical systems

FIG. 3 shows a schematic view of a comparison of a beam-shaped element, having recesses resulting from the manufacturing process, of a known micromechanical system with third embodiments of beam-shaped elements of micromechanical systems. The leftmost beam-shaped element 60 in FIG. 3, which has one exposed end 61 as well as one other end 62, is a known beam-shaped element. On account of the process used for manufacturing the beam-shaped element 60 the recesses 63 are thus distributed evenly over the surface area of the beam-shaped element 60. In fundamental contrast thereto, according to the embodiment illustrated of the—shown only in part for reasons of improved clarity—micromechanical system, the recesses of the beam-shaped elements 70, 80, 90, 100 are arranged in such a manner that the recesses 73, 83, 93, 103 are provided in such a manner in the beam-shaped elements 70, 80, 90, 100 that the mass of the beam-shaped element 70, 80, 90, 100 decreases towards the exposed end 71, 81, 91, 101. Thus it is discernible in FIG. 3 that the mass of the beam-shaped element 70, 80, 90, 100 is less in each case in the region of the exposed end 71, 81, 91, 101 than in the region of the other end 72, 82, 92, 102.

Figure 4:
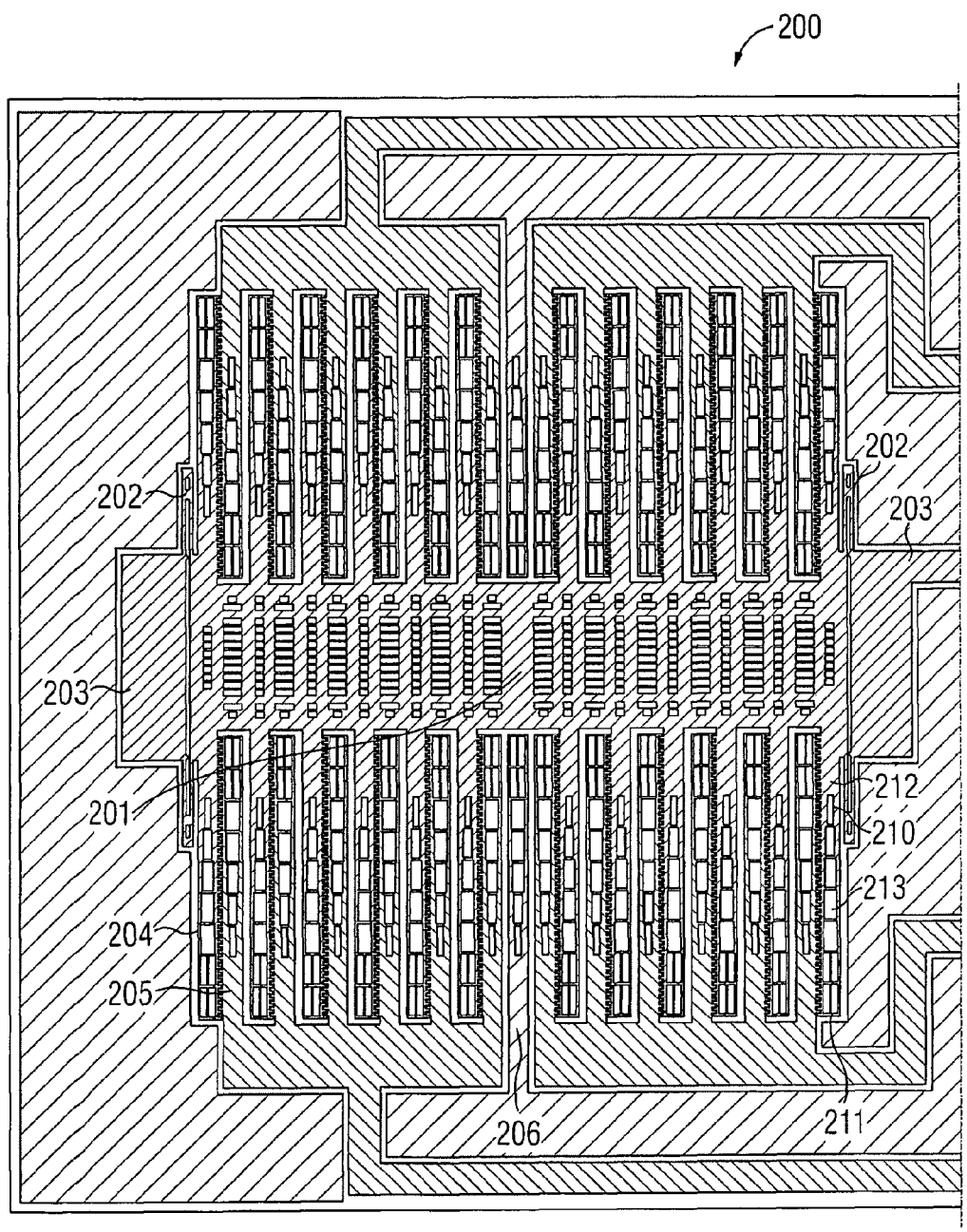
FIG. 4 is an exemplary embodiment of a micromechanical system designed as a sensor for the detection of acoustic emissions.

FIG. 4 shows an exemplary embodiment of a micromechanical system designed as a sensor for the detection of acoustic emissions. The micromechanical system 200 includes a seismic mass 201 which is connected by spring systems 202 to stationary anchor points 203. To the seismic mass 201 of the micromechanical system 200 is connected a movable electrode 204, the beam-shaped elements of which form a variable capacitance with beam-shaped elements of a fixed electrode 205, similar to intermeshing fingers. In this situation, one of the beam-shaped elements 210 of the movable electrode is identified in FIG. 4 by way of example, whereby the beam-shaped element 210 has one exposed end 211, one other end 212, connected to the seismic mass 201, and recesses 213. In addition to the movable electrode 204 and the fixed electrode 205, a shielding electrode 206 is furthermore discernible in FIG. 4.

Acoustic emissions occurring for example as a result of wear of a mechanical component, in other words of a roller bearing for example, and propagating as structure-borne sound cause a horizontal, in other words orientated in the usual X-axis, vibration of the seismic mass 201 and of the movable electrode 204 relative to the stationary or fixed electrode 205. As a result a change in capacitance occurs which is detected by the sensor for the detection of acoustic emissions (AE sensor) in the form of the micromechanical system 200 and is used for measurement of the acoustic emissions.

In order to achieve as high a natural frequency as possible of the beam-shaped elements 210 of the movable electrode 204, the fixed electrode 205 and the shielding electrode 206 with the electrodes retaining almost the same rigidity and having the same sensitivity, the movable electrode 204, the fixed electrode 205 and the shielding electrode 206 each have recesses 213 similar to those shown in FIGS. 1 to 3, which are provided in such a manner that the mass of the respective beam-shaped element 210 decreases towards its exposed end. According to the illustration in FIG. 4, the micromechanical system 200 shown in this situation has a multiplicity of appropriately optimized beam-shaped elements which fulfill different functions within the micromechanical system 200 in accordance with the above statements.

It should be noted that the recesses of the respective beam-shaped elements in the exemplary embodiments shown in the figures are each designed in rectangular form merely by way of example; in principle, the shape of the recesses can however be chosen as desired.

According to the above statements, the micromechanical system and the method have the advantage that they permit the provision of cost-effective micromechanical systems having at once high sensitivity and a high natural frequency, whereby the rigidity of the beam-shaped elements of the micromechanical system remains almost unchanged. Based on known embodiments of micromechanical systems on the one hand, an increase in the natural frequency of the beam-shaped elements with the sensitivity remaining the same and the same dimensions can thus be achieved. Alternatively or in addition thereto, a reduction in the dimensions of the beam-shaped elements and thus also of the entire micromechanical system with the natural frequency and sensitivity remaining the same is also possible.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide v. DIRECTV*, 358 F3d 870, 69 USPQ2d 1865 (Fed. Cir. 2004).

The invention claimed is:

1. A micromechanical system, comprising:
   at least one beam-shaped element with an exposed end and an opposite end, the at least one beam-shaped element having recesses provided in such a manner that the mass of the beam-shaped element decreases from the opposite end to the exposed end; and
   a further element of the micromechanical system connected to the opposite end of the at least one beam-shaped element.

2. The micromechanical system as claimed in claim 1, further comprising an electrode of which the at least one beam-shaped element is a part.

3. The micromechanical system as claimed in claim 2, further comprising a system subjected to vibration, having a seismic mass and connected to the at least one beam-shaped element as the further element.

4. The micromechanical system as claimed in claim 3, wherein the recesses are one of through-openings and blind holes.

5. The micromechanical system as claimed in claim 3, wherein the micromechanical system is a sensor.

6. The micromechanical system as claimed in claim 3, wherein the micromechanical system is a sensor for detection of acoustic emission signals.

7. The micromechanical system as claimed in claim 1, wherein the beam-shaped element is part of an electrode of the micromechanical system.

8. The micromechanical system as claimed in claim 1, wherein the opposite end of the beam-shaped element is connected to a seismic mass of the micromechanical system and has mass elements more heavily loaded compared to the mass elements of the exposed end.

9. A method for creating a micromechanical system having at least one beam-shaped element having an exposed end and connected at an opposite end to a further element of the micromechanical system, comprising:
    determining mechanical loads occurring inside mass elements of the at least one beam-shaped element during operation of the micromechanical system; and
    forming recesses to remove mass elements which are not loaded or are only lightly loaded compared to other mass elements in such a manner that the mass of the beam-shaped element decreases from the opposite end to the exposed end.

10. The method as claimed in claim 9, wherein said determining and forming are iteratively repeated.

11. The method as claimed in claim 10, wherein the recesses are formed so that the mass of the at least one beam-shaped element decreases towards the exposed end.

12. The method as claimed in claim 11, wherein said determining uses a computerized simulation model of at least the at least one beam-shaped element.

13. The method as claimed in claim 12, wherein the computerized simulation model is produced according to a finite elements method.

14. The method as claimed in claim 13, wherein the mechanical loads occurring inside mass elements of the at least one beam-shaped element during operation of the micromechanical system are determined by a comparative stress analysis.

15. The method as claimed in one of claims 14, wherein said forming of recesses produces through-openings or blind holes.

* * * * *